United States Patent
Migita et al.

(10) Patent No.: US 9,653,416 B2
(45) Date of Patent: May 16, 2017

(54) SEMICONDUCTOR SUBSTRATE AND MANUFACTURING METHOD THEREOF

(71) Applicant: OLYMPUS CORPORATION, Tokyo (JP)

(72) Inventors: Chihiro Migita, Tokyo (JP); Hisashi Ishida, Tokyo (JP); Yoshiaki Takemoto, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/044,361

(22) Filed: Feb. 16, 2016

(65) Prior Publication Data

US 2016/0163664 A1 Jun. 9, 2016

Related U.S. Application Data

(63) Continuation of application No. PCT/JP2014/067551, filed on Jul. 1, 2014.

(30) Foreign Application Priority Data

Sep. 5, 2013 (JP) ................................. 2013-184365

(51) Int. Cl.
*H01L 23/00* (2006.01)
*H01L 21/66* (2006.01)

(52) U.S. Cl.
CPC ............... *H01L 24/05* (2013.01); *H01L 24/03* (2013.01); *H01L 24/13* (2013.01); *H01L 24/94* (2013.01);
(Continued)

(58) Field of Classification Search
CPC ............. H01L 21/823871; H01L 23/52; H01L 23/522; H01L 23/528; H01L 23/5283;
(Continued)

(56) References Cited

U.S. PATENT DOCUMENTS

| 2002/0130394 | A1 | 9/2002 | Toyoda |
| 2002/0149105 | A1* | 10/2002 | Yoon .................... H01L 23/5258 257/737 |
| 2003/0027379 | A1* | 2/2003 | Liu ...................... H01L 23/5258 438/132 |

(Continued)

FOREIGN PATENT DOCUMENTS

| JP | 5-109657 A | 4/1993 |
| JP | 9-55398 A | 2/1997 |

(Continued)

OTHER PUBLICATIONS

English Written Opinion for PCT/JP2014/067551 mailed Oct. 7, 2014.*

(Continued)

*Primary Examiner* — Khiem D Nguyen
*Assistant Examiner* — Pauline Vu
(74) *Attorney, Agent, or Firm* — Westerman, Hattori, Daniels & Adrian, LLP (57) ABSTRACT

A method of manufacturing a semiconductor substrate includes a device-forming process of forming a plurality of device areas in a substrate section, a first wiring process of forming circuit wirings connected to the plurality of device areas, an electrode pad-forming process of forming a plurality of electrode pads, a second wiring process of forming a potential adjustment wiring electrically connecting at least a part of the electrode pads, an electrode-forming process of forming electrode bodies on the electrode pads by electroless plating after the second wiring process, and a potential adjustment-releasing process of releasing a connection by the potential adjustment wiring after the electrode-forming process.

10 Claims, 8 Drawing Sheets

(52) U.S. Cl.
CPC .... *H01L 22/14* (2013.01); *H01L 2224/03001* (2013.01); *H01L 2224/0347* (2013.01); *H01L 2224/03464* (2013.01); *H01L 2224/0401* (2013.01); *H01L 2224/05009* (2013.01); *H01L 2224/05644* (2013.01); *H01L 2224/05647* (2013.01); *H01L 2224/05655* (2013.01); *H01L 2224/13026* (2013.01); *H01L 2224/94* (2013.01)

(58) Field of Classification Search
CPC ............... H01L 23/538; H01L 23/5386; H01L 23/5226; H01L 24/94; H01L 24/03–24/17; H01L 23/5256; H01L 23/62; H01L 23/5258
See application file for complete search history.

(56) References Cited

U.S. PATENT DOCUMENTS

| | | | | |
|---|---|---|---|---|
| 2003/0080422 | A1* | 5/2003 | Ohara | ................... H01L 21/288 257/738 |
| 2004/0219375 | A1* | 11/2004 | Kawaguchi | ............. C23C 18/48 428/457 |
| 2005/0277283 | A1* | 12/2005 | Lin | ................... H01L 23/53238 438/618 |
| 2009/0079073 | A1* | 3/2009 | Mizusawa | ........... H01L 23/3114 257/738 |
| 2011/0127647 | A1* | 6/2011 | Tsukakoshi | ............. H01L 21/78 257/620 |
| 2013/0256889 | A1* | 10/2013 | Takemoto | ............... H01L 23/48 257/741 |

FOREIGN PATENT DOCUMENTS

| | | |
|---|---|---|
| JP | 2000-124279 A * | 4/2000 |
| JP | 2002-217196 A | 8/2002 |
| JP | 2006-117963 A | 5/2006 |

OTHER PUBLICATIONS

International Search Report dated Oct. 7, 2014, issued in counterpart International Application No. PCT/JP2014/067551 (2 pages).

* cited by examiner

SEMICONDUCTOR SUBSTRATE AND MANUFACTURING METHOD THEREOF

This application is a continuation application of PCT Patent Application No. PCT/JP2014/067551, filed Jul. 1, 2014, whose priority is claimed on Japanese Patent Application No. 2013-184365, filed Sep. 5, 2013. The contents of both the Japanese patent application and the PCT patent application are incorporated herein by reference.

BACKGROUND OF THE INVENTION

Field of the Invention

The present invention relates to a semiconductor substrate, and more particularly, to a semiconductor substrate in which a plurality of electrodes are formed on a base material to protrude therefrom, and a method of manufacturing the semiconductor substrate.

Description of Related Art

For the purpose of enhancing the functionality and downsizing of a system, there has been a demand for a semiconductor device having a smaller size and higher performance, and a technique called "silicon wafer direct bonding" of bonding wafers on which a plurality of micro bumps serving as electrodes are formed to each other has been studied. Such silicon wafer direct bonding is used for micro electromechanical systems (MEMS) devices or the like.

In the silicon wafer direct bonding, in order to electrically connect silicon wafers via bumps, a load needs to be applied to the wafers and a required load increases with an increase in the number of bumps. For example, when bumps with a diameter of about 10 μm are formed on an entire surface of a wafer, for example, with a diameter of 8 inches (20.32 cm), the number of bumps is several hundreds of millions and a load required for bonding is several tons. Here, when the bumps have uneven heights, the load is first concentrated on the highest bump and the bump may be damaged. Accordingly, in order to accomplish a decrease in bonding load, a method of planarizing the top surfaces of the bumps by grinding, chemical-mechanical polishing (CMP), or the like has been studied, but it is not easy to evenly planarize several hundreds of millions of bumps without damage and there is a problem in delivery time and cost.

In this regard, Japanese Unexamined Patent Application, First Publication No. H09-55398 discloses a problem in which an amount of electrode material deposited in a plating process varies depending on electrode pads having different potentials, and thus the thickness (that is, the height of an electrode) varies depending on the electrode pads. In order to solve this problem, a method of forming short-circuit wiring patterns short-circuiting the electrode pads in dicing lines, forming electrodes by plating, and cutting the short-circuit wiring patterns in a dicing process has been proposed. By employing this configuration, potential differences between the electrode pads decrease due to the short-circuit wiring patterns and it is thus possible to suppress any unevenness in thickness.

SUMMARY OF THE INVENTION

According to a first aspect of the present invention, a method of manufacturing a semiconductor substrate in which a plurality of device areas functioning as a semiconductor device are disposed, and an electrode portion including a plurality of electrodes in which electrode bodies are formed on respective electrode pads is formed in each of the plurality of device areas, includes: a device-forming process of forming the plurality of device areas in a substrate section; a first wiring process of forming circuit wirings connected to the device areas; an electrode pad-forming process of forming the electrode pads; a second wiring process of forming a potential adjustment wiring electrically connecting at least a part of the electrode pads; an electrode-forming process of forming the electrode bodies on the electrode pads by electroless plating after the second wiring process; and a potential adjustment-releasing process of releasing a connection by the potential adjustment wiring after the electrode-forming process.

According to a second aspect of the present invention, in the method of manufacturing the semiconductor substrate according to the first aspect of the present invention, the first wiring process and the second wiring process may be simultaneously carried out.

According to a third aspect of the present invention, in the method of manufacturing the semiconductor substrate according to the first aspect of the present invention, the device-forming process and the second wiring process may be simultaneously carried out.

According to a fourth aspect of the present invention, in the method of manufacturing the semiconductor substrate according to the first aspect of the present invention, the electrode pad-forming process and the second wiring process may be simultaneously carried out.

According to a fifth aspect of the present invention, in the method of manufacturing the semiconductor substrate according to the first aspect of the present invention, the potential adjustment wiring may be formed of a conductive resin.

According to a sixth aspect of the present invention, in the method of manufacturing the semiconductor substrate according to any one of the first to fifth aspects of the present invention, the potential adjustment-releasing process may be performed by irradiation with a laser beam.

According to a seventh aspect of the present invention, in the method of manufacturing the semiconductor substrate according to the fifth aspect of the present invention, the potential adjustment-releasing process may be performed by an ashing process.

According to an eighth aspect of the present invention, in the method of manufacturing the semiconductor substrate according to any one of the first to fifth aspects of the present invention, the potential adjustment-releasing process may be performed by application of a voltage between the electrodes.

According to a ninth aspect of the present invention, in the method of manufacturing the semiconductor substrate according to any one of the first to eighth aspects of the present invention, the potential adjustment wiring may be formed to electrically connect all the electrodes in each of the device areas.

According to a tenth aspect of the present invention, in the method of manufacturing the semiconductor substrate according to any one of the first to eighth aspects of the present invention, the plurality of electrodes may be partitioned into a plurality of groups. The potential adjustment wiring may be formed to electrically connect all of the electrodes in each of the groups.

According to an eleventh aspect of the present invention, a semiconductor substrate includes: a substrate section in which a plurality of device areas functioning as a semiconductor device are formed; an electrode portion including a plurality of electrodes having electrode pads formed on the substrate section and electrode bodies formed on the respective electrode pads, the electrode portion being disposed in each of the device areas; a circuit wiring connected to at least one of the device areas and the electrodes, the circuit wiring constituting a circuit for causing the device areas to function as the semiconductor device; and a potential adjustment wiring electrically connecting the plurality of electrodes regardless of the circuit.

According to a twelfth aspect of the present invention, in the semiconductor substrate according to the eleventh aspect of the present invention, the potential adjustment wiring may be formed of a conductive resin.

According to a thirteenth aspect of the present invention, in the semiconductor substrate according to the eleventh or twelfth aspect of the present invention, all the electrodes in each of the device areas may be electrically connected to each other by the potential adjustment wiring.

According to a fourteenth aspect of the present invention, in the semiconductor substrate according to the eleventh or twelfth aspect of the present invention, the plurality of electrodes may be partitioned into a plurality of groups. The potential adjustment wiring may electrically connect all the electrodes in each of the groups.

DETAILED DESCRIPTION OF THE INVENTION (First Embodiment)

Figure 1:
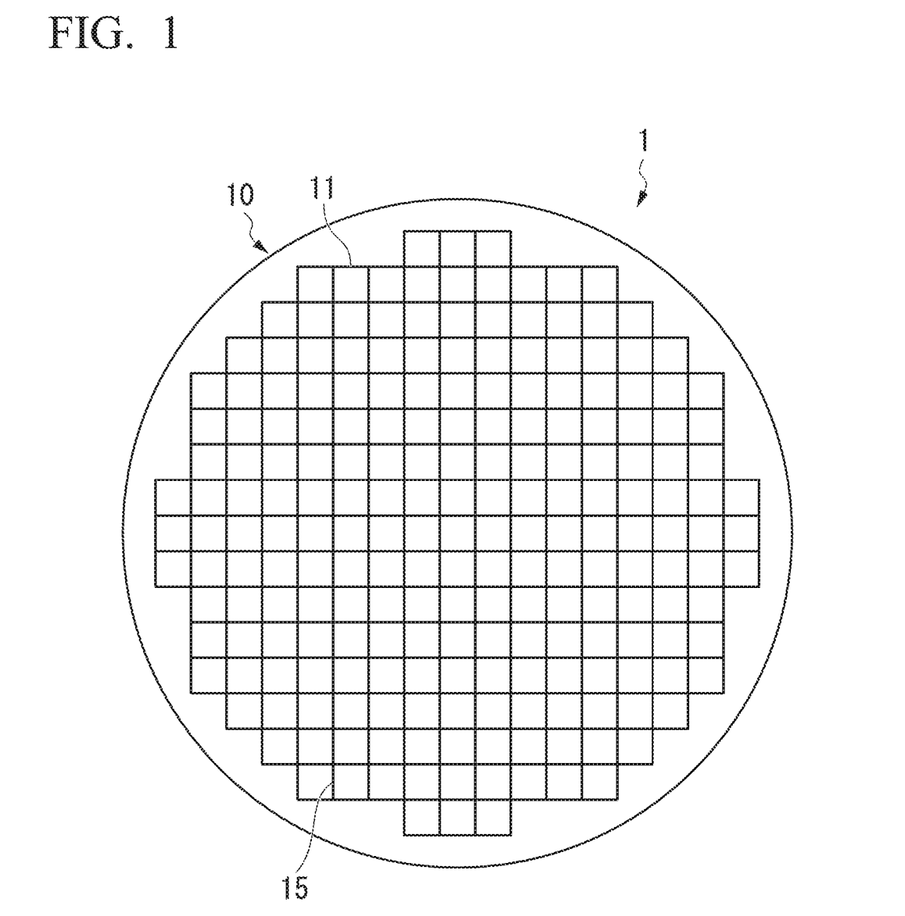
FIG. 1 is a plan view illustrating a semiconductor substrate according to a first embodiment of the present invention.

A first embodiment of the present invention will be described below with reference to FIGS. 1 to 10. FIG. 1 is a plan view illustrating a semiconductor substrate 1 according to this embodiment. The semiconductor substrate 1 includes a plate-like or sheet-like substrate section 10.

The substrate section 10 is formed of a silicon wafer, and a plurality of device areas 11 functioning as semiconductor devices are formed in the substrate section 10. In this embodiment, a silicon wafer in which a plurality of device areas 11 having a three-dimensional structure are formed is used as the substrate section 10.

As illustrated in FIG. 1, the plurality of device areas 11 are arranged two-dimensionally in a plan view of the substrate section 10. Each of the device areas 11 includes an electrode portion in which a plurality of electrodes are formed, and a layout of the plurality of electrodes in each of the device areas 11 is the same. Scribe lines 15 are formed in boundaries of the device areas 11. The scribe lines 15 are cut by dicing or the like in segmenting the device areas 11.

Figure 2:
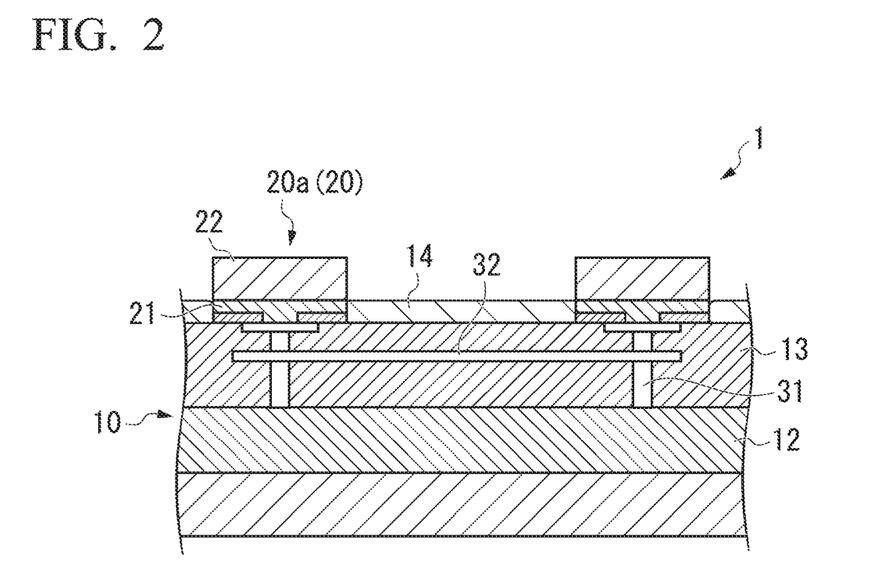
FIG. 2 is a schematic cross-sectional view illustrating a part of a device area in the semiconductor substrate.
Figure 3:
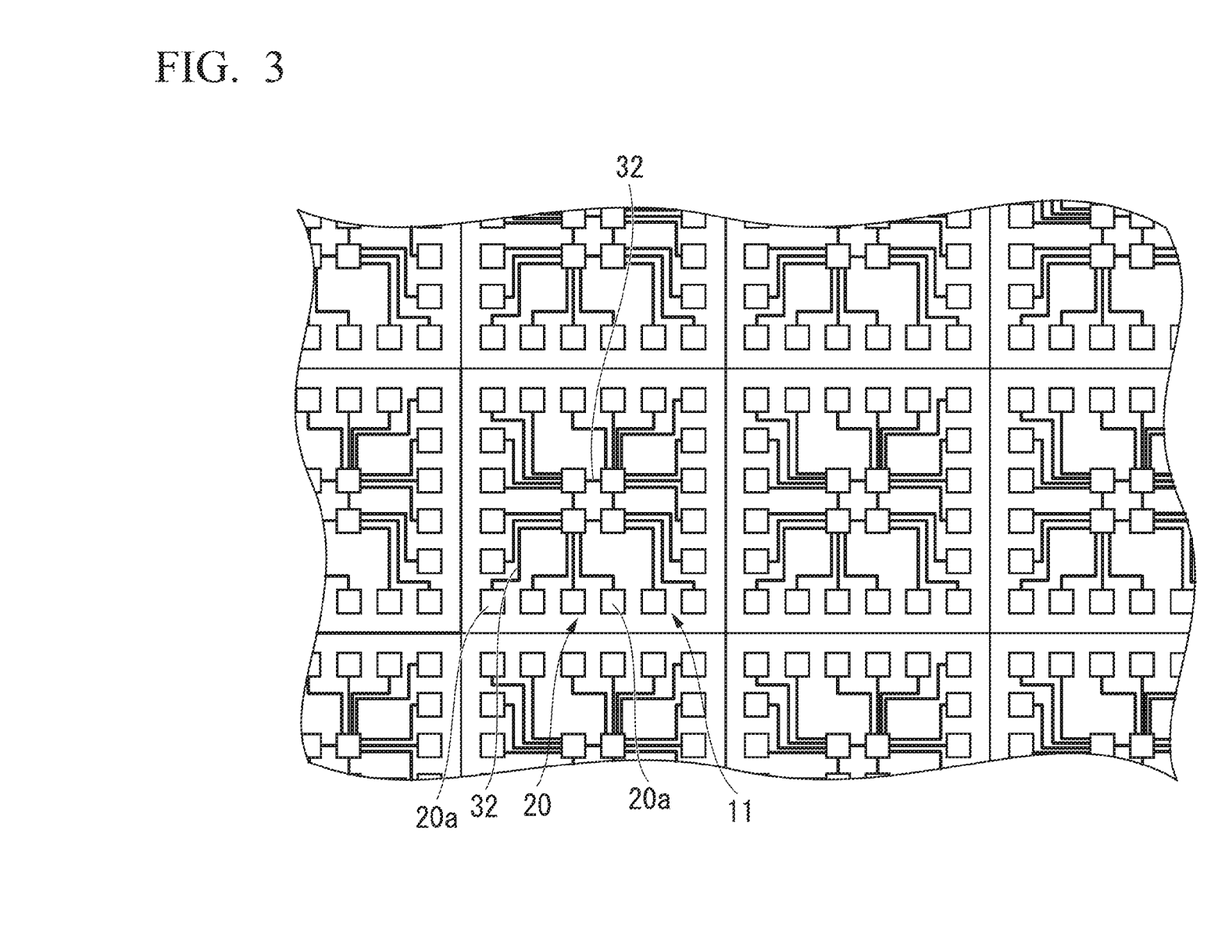
FIG. 3 is a schematic diagram illustrating a layout example of potential adjustment wirings in the semiconductor substrate.

FIG. 2 is a schematic cross-sectional view illustrating a part of a device area 11 in the semiconductor substrate 1. The device area 11 includes a diffusion layer 12 functioning as a semiconductor device, a circuit wiring 31 electrically connecting an electrode portion 20 and the diffusion layer 12, and a potential adjustment wiring 32 electrically connecting electrodes 20a of the electrode portion 20.

The electrode portion 20 is formed in each of the device areas 11 and includes a plurality of electrodes 20a. Each of the electrodes 20a includes an electrode pad 21 connected to the circuit wiring 31 and an electrode body 22 formed on the electrode pad 21 by electroless plating. The electrode pad 21 and the electrode body 22 are formed of metal, and, for example, gold, copper, nickel, and an alloy including at least one of these metals can be used as a material thereof.

The circuit wiring 31 and the potential adjustment wiring 32 are formed in a wiring layer 13 formed on the diffusion layer 12. The electrode pads 21 are formed on the wiring layer 13. An area in which the electrode portion 20 is not formed on the top surface of the wiring layer 13 may be coated with a protective film 14. The circuit wiring 31 connects the diffusion layer 12 and the electrodes 20a of the electrode portion 20 so as to constitute a circuit enabling the device area 11 to function as a semiconductor device. The potential adjustment wiring 32 is formed to electrically connect all the electrodes 20a of the electrode portion 20 as illustrated in the schematic diagram of FIG. 3. The connection of the electrodes 20a using the potential adjustment wiring 32 is not associated with the above-mentioned circuit, and the potential adjustment wiring 32 does not contribute to the constitution of the above-mentioned circuit. Accordingly, the device areas 11 of the semiconductor substrate 1 do not establish a circuit due to the presence of the potential adjustment wiring 32, and thus do not function as semiconductor devices in this state.

Figure 4:
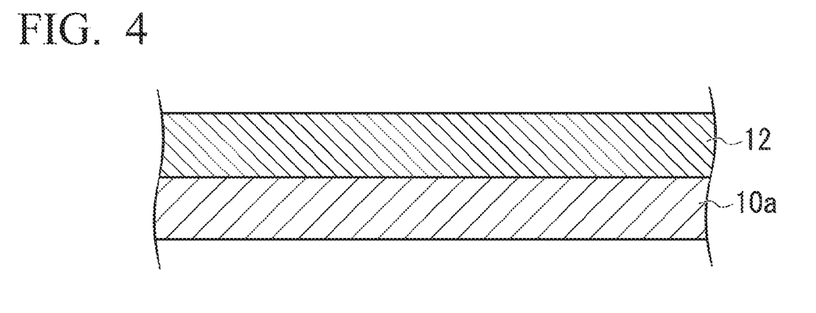
FIG. 4 is a diagram illustrating a process of manufacturing the semiconductor substrate.
Figure 5:
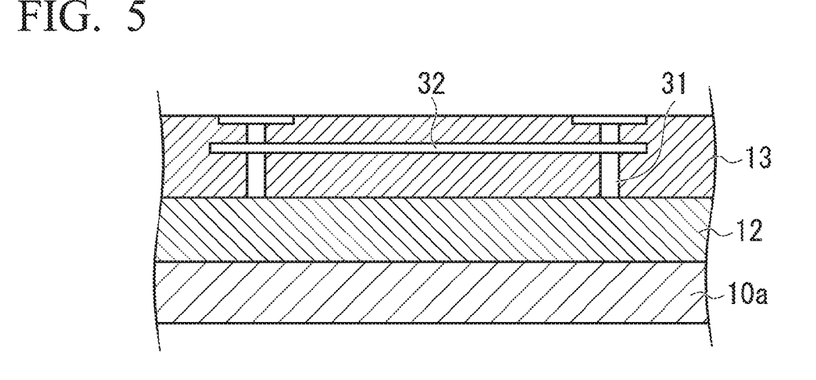
FIG. 5 is a diagram illustrating a process of manufacturing the semiconductor substrate.

An example of a process of manufacturing the semiconductor substrate 1 having the above-mentioned configuration will be described below. First, as illustrated in FIG. 4, a diffusion layer 12 including a plurality of device areas is formed on a silicon substrate 10a as a substrate section (a device-forming process). Then, as illustrated in FIG. 5, a wiring layer 13 including circuit wirings 31 and a potential adjustment wiring 32 is formed on the diffusion layer 12. The process of forming the wiring layer 13 includes a first wiring process of forming the circuit wirings 31 and a second wiring process of forming the potential adjustment wiring 32. In this embodiment, the first wiring process and the second wiring process are simultaneously performed in the same process. A known technique of a multilayer semiconductor device can be used to form the diffusion layer 12 and the wiring layer 13.

Figure 6:
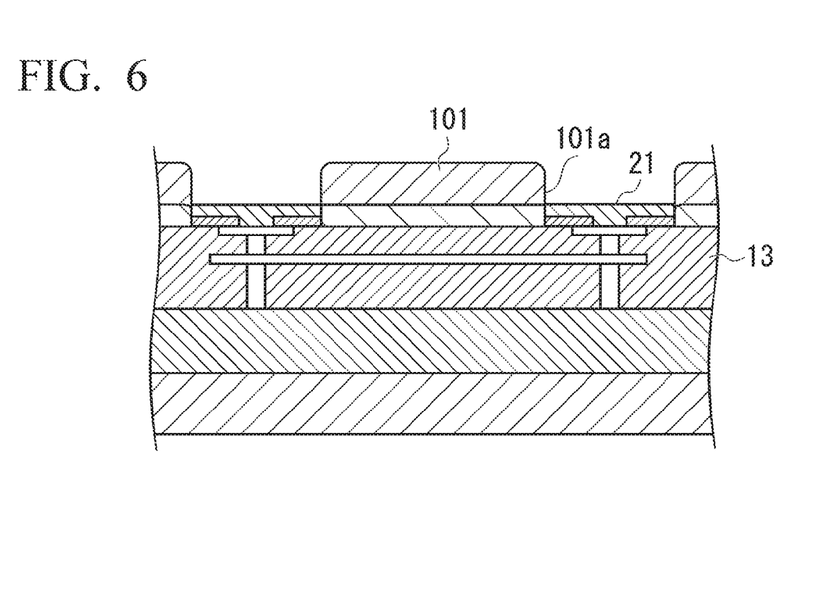
FIG. 6 is a diagram illustrating a process of manufacturing the semiconductor substrate.

Subsequently, as illustrated in FIG. 6, electrode pads 21 are formed on the wiring layer 13 (an electrode pad-forming process), and then a plated resist layer 101 having openings 101a corresponding to the positions of the electrode pads 21 is formed.

Figure 7:
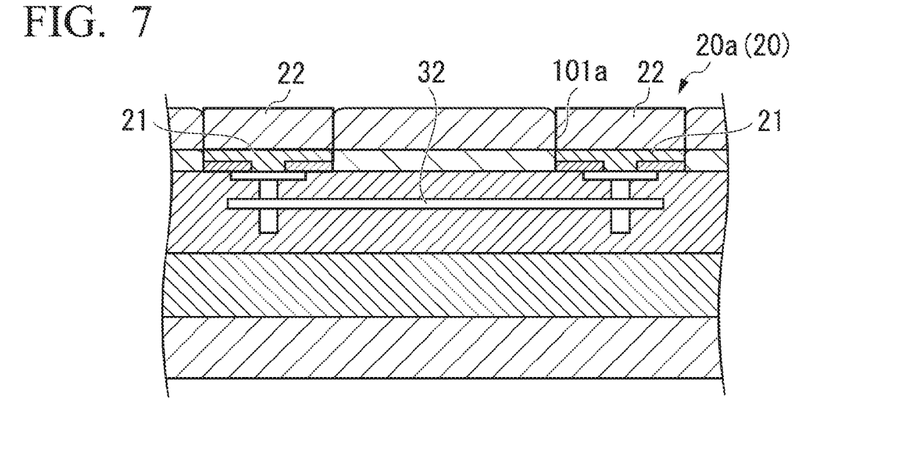
FIG. 7 is a diagram illustrating a process of manufacturing the semiconductor substrate.

Subsequently, electroless plating using the material of the electrode body is performed, and as illustrated in FIG. 7, electrode bodies 22 are formed on the electrode pads 21 in the openings 101a (an electrode-forming process). When the electrode bodies are formed by electroless plating, the growth rate of an electrode body varies depending on the potential of the electrode pad. The potential of each electrode pad varies depending on conditions such as the area in a plan view of the electrode pad or the position of the diffusion layer connected to the electrode pad. In this embodiment, since all the electrode pads 21 are electrically connected to each other by the potential adjustment wiring 32, the potentials of all the electrode pads are equal or substantially equal to each other regardless of the above conditions. Accordingly, since the electrode bodies 22 are formed while growing substantially at the same speed on all the electrode pads 21, the electrode portion 20 in which the height unevenness of the electrodes 20a is markedly suppressed is formed.

Figure 8:
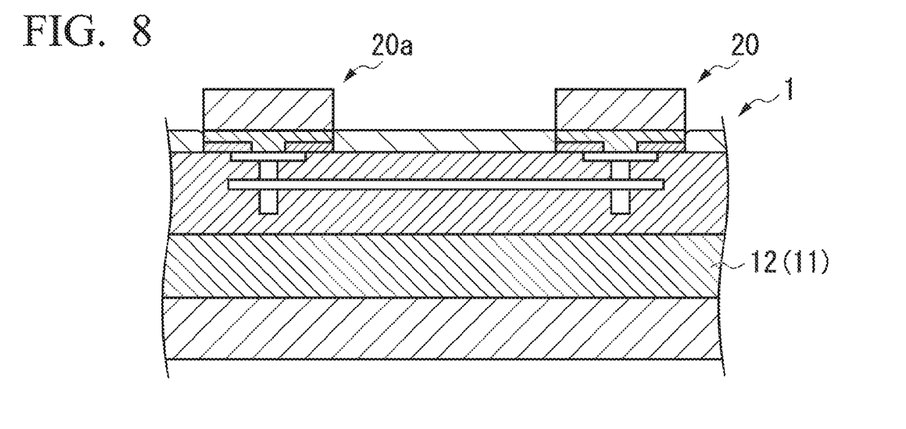
FIG. 8 is a diagram illustrating a process of manufacturing the semiconductor substrate.

When the plated resist layer 101 is removed after the electrode portion 20 is formed, the semiconductor substrate 1 is completed as illustrated in FIG. 8. In the semiconductor substrate 1, the heights of the electrodes 20a in the electrode portion 20 are uniform, but a circuit is not established as described above. Thus, characteristics of semiconductor devices formed by the device areas 11 cannot be inspected.

Figure 9:
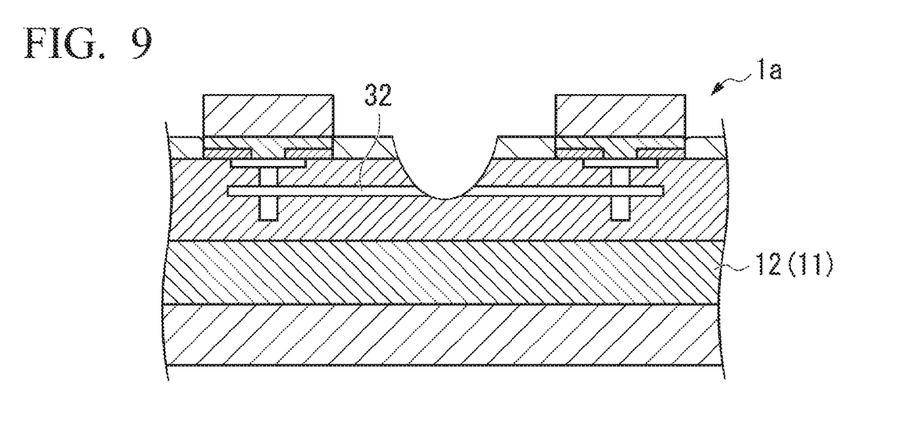
FIG. 9 is a schematic cross-sectional view illustrating the semiconductor substrate after an additional process is performed.

Therefore, the top surface of the semiconductor substrate 1 is irradiated with a laser beam as an additional process, and the potential adjustment wiring 32 is cut in a state in which the device areas 11 are not segmented as illustrated in FIG. 9 (a potential adjustment-releasing process). Accordingly, the semiconductor substrate 1 becomes a semiconductor substrate 1a on which characteristic inspection can be performed. Since a circuit is established in each device area 11 of the semiconductor substrate 1a, the characteristics of the device area 11 in a wafer state can be inspected. When the device areas 11 are segmented by dicing or the like after the characteristic inspection is completed, the segmented device areas are completed as semiconductor devices.

As described above, since the semiconductor substrate 1 according to this embodiment includes the potential adjustment wiring 32, it is possible to provide a semiconductor substrate including the electrode portion 20 in which the height unevenness of the electrode bodies 22 formed by electroless plating is markedly suppressed and the heights of the electrodes 20a are controlled to be uniform. By cutting the potential adjustment wiring 32 after the formation, it is possible to easily establish a circuit in each device area 11 and to inspect characteristics of the device areas in a wafer state. As a result, it is possible to efficiently perform quality control.

In the method of manufacturing a semiconductor substrate according to this embodiment, by performing the electrode-forming process after the second wiring process and performing the potential adjustment-releasing process after the electrode-forming process, it is possible to perform both the formation of the electrode portion in which the heights of the electrodes are controlled to be uniform and the characteristic inspection in a wafer state.

Figure 10:
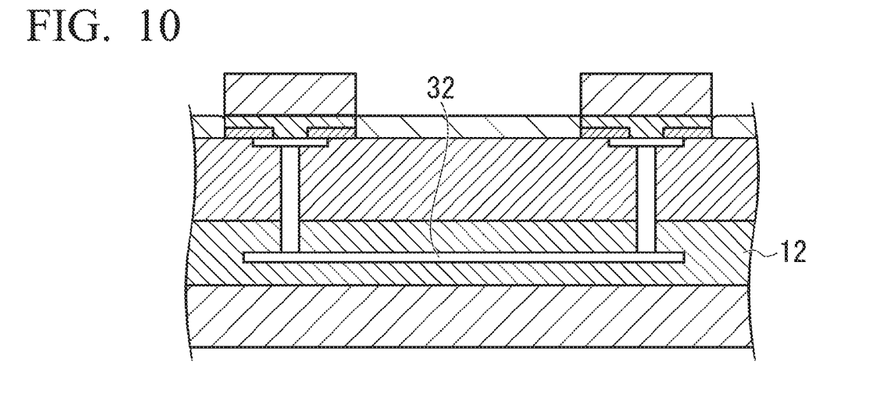
FIG. 10 is a schematic cross-sectional view illustrating a part of a device area in a modified example of the semiconductor substrate.

In this embodiment, an example in which the potential adjustment wiring 32 is formed in the wiring layer 13 is described above, but, instead, the potential adjustment wiring 32 may be formed in the diffusion layer 12 as in a modified example illustrated in FIG. 10. The specific method of the potential adjustment-releasing process is not limited to irradiation with a laser beam. For example, the potential-adjusted state may be released by applying a voltage between two electrodes and fusing and cutting the potential adjustment wiring using generated heat. When the potential adjustment wiring formed in the diffusion layer is cut with a laser beam, it is necessary to note the formation position of the potential adjustment wiring or the irradiation mode of a laser beam so that other areas of the diffusion layer are not affected. Accordingly, the application of a voltage can be particularly effectively used in this case.

(Second Embodiment)

A second embodiment of the present invention will be described below with reference to FIGS. 11 to 14. A semiconductor substrate according to this embodiment is different from the semiconductor substrate 1 according to the first embodiment in the formation position and the cutting method of the potential adjustment wiring. In the following description, the same configurations as described above will be referenced by the same reference numerals or signs and description thereof will not be repeated.

Figure 11:
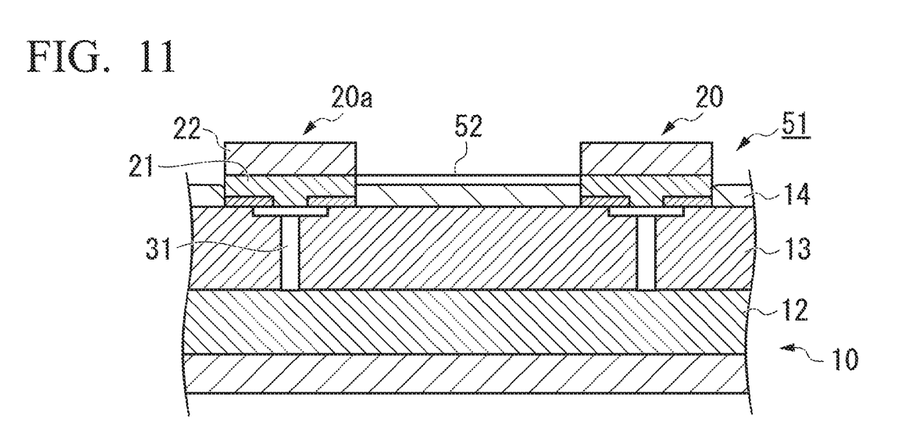
FIG. 11 is a schematic cross-sectional view illustrating a part of a device area in a semiconductor substrate according to a second embodiment of the present invention.

FIG. 11 is a schematic cross-sectional view of one device area in a semiconductor substrate 51 according to this embodiment. As illustrated in FIG. 11, a potential adjustment wiring 52 is formed on a protective film 14 formed on a wiring layer 13. When an area in which an electrode portion 20 is not formed on a top surface of the wiring layer 13 is not covered with the protective film 14, the potential adjustment wiring 52 may be formed on the wiring layer 13. An example of the material of the potential adjustment wiring 52 is a conductive resin. Both of a conductive resin in which conductive fillers and the like are mixed in the resin and a conductive resin in which the resin itself has conductivity can be used.

Figure 12:
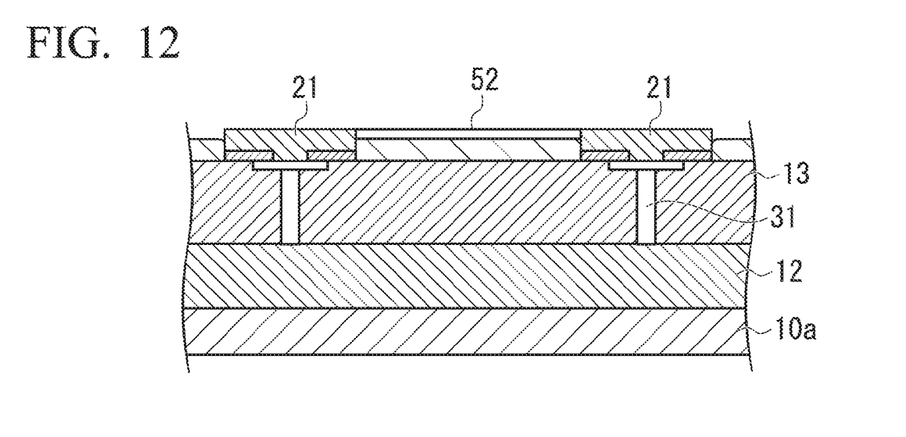
FIG. 12 is a diagram illustrating a process of manufacturing the semiconductor substrate.

A process of manufacturing the semiconductor substrate 51 will be described below. The wiring layer 13 including circuit wirings 31 is formed after a diffusion layer 12 is formed. Subsequently, as illustrated in FIG. 12, electrode pads 21 and the potential adjustment wiring 52 are formed on the wiring layer 13. The formation of the potential adjustment wiring 52 may be performed before or after the formation of the electrode pads 21. When the potential adjustment wiring 52 is formed of the same material as the electrode pads 21, the electrode pads 21 and the potential adjustment wiring 52 may be simultaneously formed.

Figure 13:
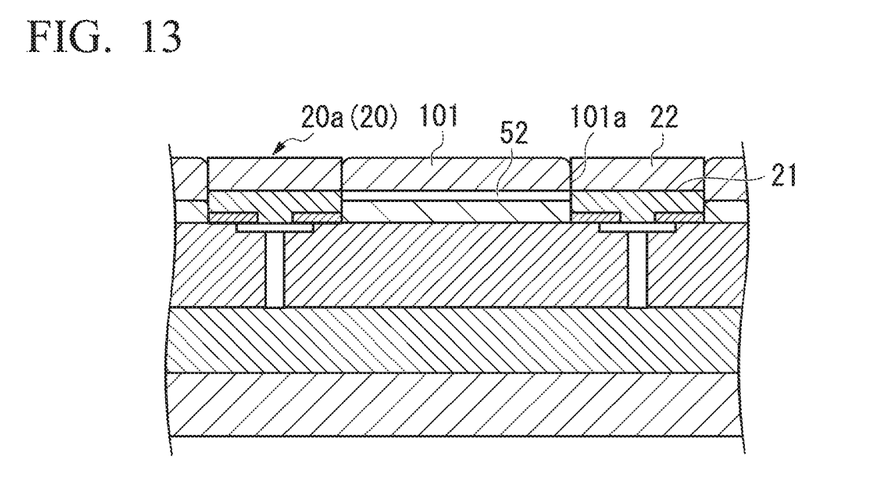
FIG. 13 is a diagram illustrating a process of manufacturing the semiconductor substrate.

Subsequently, as illustrated in FIG. 13, electrode bodies 22 are formed by electroless plating as in the first embodiment. Since the potentials of the electrode pads 21 are uniformized by the potential adjustment wiring 52, the electrode portion 20 in which the heights of the electrodes 20a are controlled to be uniform is formed.

Figure 14:
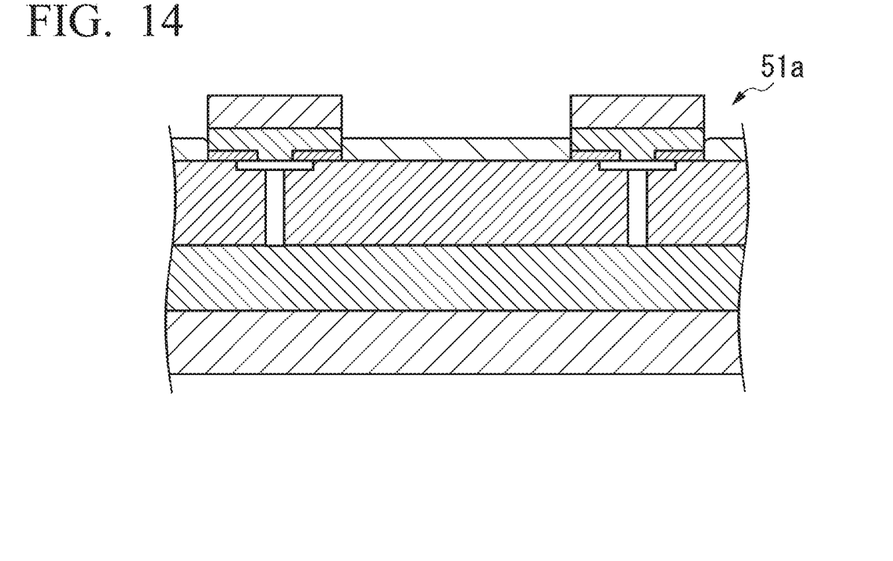
FIG. 14 is a schematic cross-sectional view illustrating the semiconductor substrate after an additional process is performed.

When a plated resist layer 101 is removed after the formation of the electrode portion 20, the semiconductor substrate 51 illustrated in FIG. 11 is completed. Thereafter, when an ashing process is performed, the potential adjustment wiring 52 is lost or cut and potential adjustment is released to establish a circuit with the circuit wirings 31 as illustrated in FIG. 14. When the ashing process is finished, the semiconductor substrate 51 becomes a semiconductor substrate 51a on which characteristic inspection can be performed.

In the semiconductor substrate 51 according to this embodiment, as in the first embodiment, it is possible to provide a semiconductor substrate including the electrode portion in which the heights of the electrodes are controlled to be uniform and which can be subjected to characteristic inspection in a wafer state by cutting the potential adjustment wiring. By forming the potential adjustment wiring on the wiring layer 13, it is not necessary to secure an area in which the potential adjustment wiring is formed in the wiring layer 13.

In this embodiment, an example in which the potential adjustment wiring cutting process is performed by ashing is described above, but irradiation with a laser beam or application of a voltage may be used instead as in the first embodiment. In addition to the conductive resin, metals such as gold, copper, nickel, and an alloy including at least one of these metals can be used as a material of the potential adjustment wiring 52. When a metal is used as the material of the potential adjustment wiring 52, the potential adjustment wiring 52 can be cut by performing irradiation with a laser beam or application of a voltage instead of the ashing process.

Figure 15:
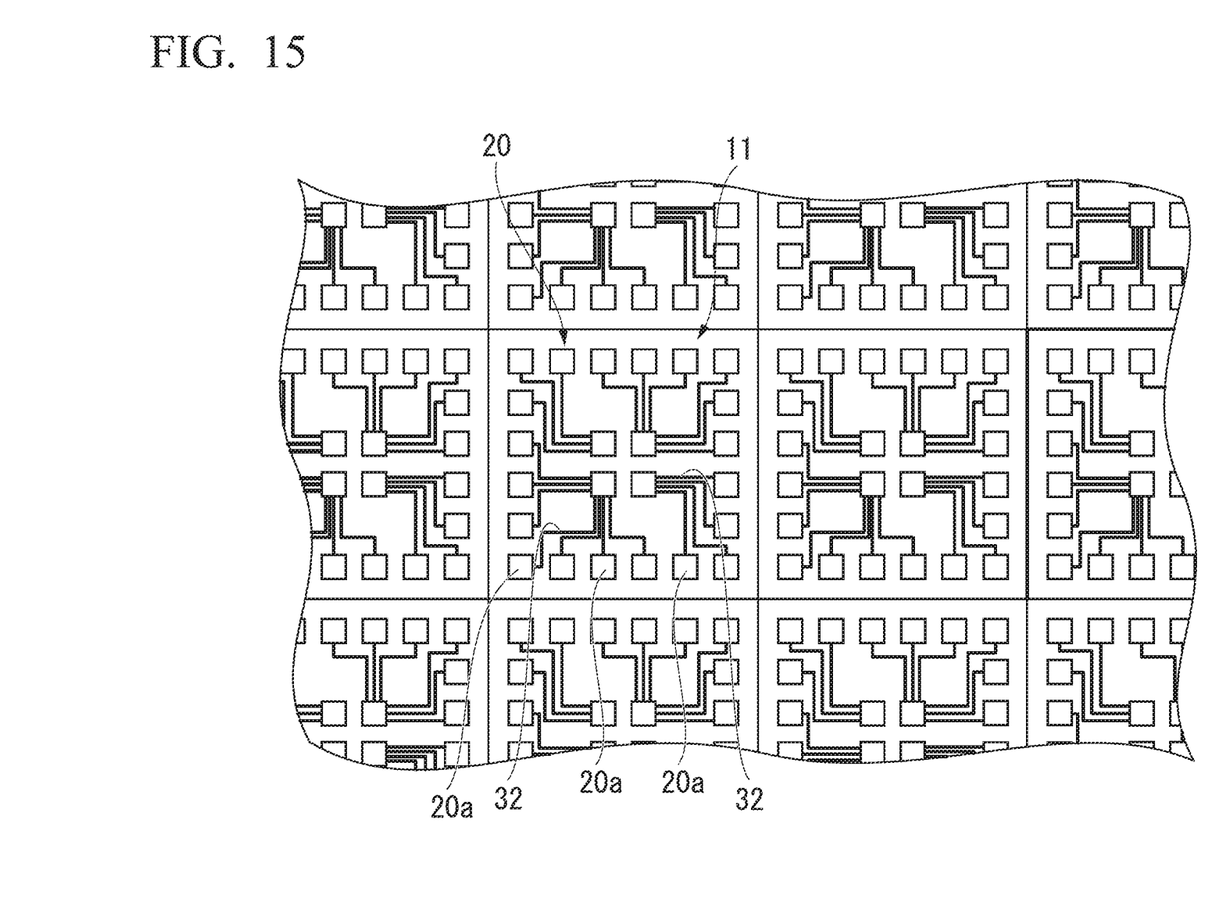
FIG. 15 is a schematic diagram illustrating a layout example of potential adjustment wirings in a semiconductor substrate according to a modified example of the present invention.

In the above-mentioned embodiments, an example in which all the electrode pads in the device areas are electrically connected to each other with the potential adjustment wiring is described, but instead, as in a modified example illustrated in FIG. 15, the electrodes 20a of the electrode portion 20 may be partitioned into several groups (for example, four groups in FIG. 15) and all the electrode pads 21 of the electrodes 20a in each group may be connected to each other by the potential adjustment wiring 32. In this case, since the heights of the electrodes 20a in each group are uniform, the height unevenness of the electrode portion 20 is suppressed as a whole and a predetermined effect can be achieved.

In addition to the semiconductor devices formed in the diffusion layer, a semiconductor chip having another semiconductor device formed therein or a semiconductor package having a semiconductor chip built therein may be mounted on or built in each device area of the semiconductor substrate according to the above-mentioned embodiments.

In the above-mentioned embodiments, an example of a semiconductor substrate in which a plurality of one type of device areas are formed is described, but instead, a plurality of device areas different in device function, electrode arrangement, or the like may be formed. In this case, since the heights of the electrodes in each device area are uniform by the potential adjustment wiring, it is possible to manufacture a semiconductor substrate in which the height unevenness of the electrodes is suppressed.

While exemplary embodiments of the present invention have been described above, the present invention is not limited to the embodiments. An element can be added, omitted, substituted, and modified without departing from the spirit and scope of the present invention. The present invention is not limited by the above-mentioned description, and is only limited by the appended claims.

What is claimed is:

1. A method of manufacturing a semiconductor substrate in which a plurality of device areas functioning as a semiconductor device are disposed, and an electrode portion including a plurality of electrodes in which electrode bodies are formed on respective electrode pads is formed in each of the plurality of device areas, the method comprising:
   a device-forming process of forming the plurality of device areas in a substrate section;
   a first wiring process of forming circuit wirings connected to the plurality of device areas;
   an electrode pad-forming process of forming the respective electrode pads;
   a second wiring process of forming a potential adjustment wiring electrically connecting at least a part of the respective electrode pads;
   an electrode-forming process of forming the electrode bodies on the respective electrode pads by electroless plating after the second wiring process; and
   a potential adjustment-releasing process of releasing a connection by the potential adjustment wiring after the electrode-forming process.

2. The method of manufacturing the semiconductor substrate according to claim 1, wherein the first wiring process and the second wiring process are simultaneously carried out.

3. The method of manufacturing the semiconductor substrate according to claim 1, wherein the device-forming process and the second wiring process are simultaneously carried out.

4. The method of manufacturing the semiconductor substrate according to claim 1, wherein the electrode pad-forming process and the second wiring process are simultaneously carried out.

5. The method of manufacturing the semiconductor substrate according to claim 1, wherein the potential adjustment wiring is formed of a conductive resin.

6. The method of manufacturing the semiconductor substrate according to claim 1, wherein the potential adjustment-releasing process is performed by irradiation with a laser beam.

7. The method of manufacturing the semiconductor substrate according to claim 5, wherein the potential adjustment-releasing process is performed by an ashing process.

8. The method of manufacturing the semiconductor substrate according to claim 1, wherein the potential adjustment-releasing process is performed by application of a voltage between the plurality of electrodes.

9. The method of manufacturing the semiconductor substrate according to claim 1, wherein the potential adjustment wiring is formed to electrically connect all of the plurality of electrodes in each of the plurality of device areas.

10. The method of manufacturing the semiconductor substrate according to claim 1, wherein
   the plurality of electrodes are partitioned into a plurality of groups, and
   the potential adjustment wiring is formed to electrically connect all of the plurality of electrodes in each of the plurality of groups.

* * * * *